United States Patent [19]

Zorabedian

[11] Patent Number: 5,325,378
[45] Date of Patent: * Jun. 28, 1994

[54] MISALIGNMENT-TOLERANT, GRATING-TUNED EXTERNAL-CAVITY LASER WITH ENHANCED LONGITUDINAL MODE SELECTIVITY

[75] Inventor: Paul Zorabedian, Mountain View, Calif.

[73] Assignee: Hewlett-Packard Company, Palo Alto, Calif.

[*] Notice: The portion of the term of this patent subsequent to Jan. 5, 2010 has been disclaimed.

[21] Appl. No.: 992,283

[22] Filed: Dec. 16, 1992

Related U.S. Application Data

[63] Continuation of Ser. No. 737,625, Jul. 30, 1991, Pat. No. 5,177,750.

[51] Int. Cl.$^5$ .................................. H01S 3/10
[52] U.S. Cl. ........................... 372/20; 372/102; 372/107; 372/101
[58] Field of Search .............. 372/20, 92, 98, 101, 372/107, 102, 97, 33, 100; 359/569

[56] References Cited

U.S. PATENT DOCUMENTS

| | | | |
|---|---|---|---|
| 3,974,507 | 8/1976 | Chemelli et al. | 346/76 L |
| 4,203,652 | 5/1980 | Hanada | 350/182 |
| 4,253,735 | 3/1981 | Kawamura et al. | 350/409 |
| 4,318,594 | 3/1982 | Hanada | 350/433 |
| 4,410,237 | 10/1983 | Veldkamp | 350/320 |
| 4,530,574 | 7/1985 | Scifres et al. | 350/420 |
| 4,589,115 | 5/1986 | Burnham et al. | 372/20 |
| 4,656,641 | 4/1987 | Scifres et al. | 372/103 |
| 4,942,583 | 7/1990 | Nazarathy et al. | 372/20 |
| 5,177,750 | 1/1993 | Zorabedian | 372/20 |

FOREIGN PATENT DOCUMENTS

0143372  6/1989  Japan.

OTHER PUBLICATIONS

Kasuya et al., "A Prism Ananorphic System for Gaussiar Beam Expander", Appl. Phys, 17, No. 2, Oct. 1978, pp. 131-136.

*Primary Examiner*—Georgia Y. Epps

[57] ABSTRACT

A grating tuned external cavity laser having improved mode selectivity and stability. A cylindrical lens is positioned between a laser amplifier and a prism pair beam expander to focus the laser beam to form a linear spot on a grating. The location of the cylindrical lens between the laser amplifier and the prism pair minimizes the optical length of the laser cavity. In this way, the wavelength separation between optical resonance modes is increased, and the mode selectivity and stability of the system is enhanced.

16 Claims, 3 Drawing Sheets

MISALIGNMENT-TOLERANT, GRATING-TUNED EXTERNAL-CAVITY LASER WITH ENHANCED LONGITUDINAL MODE SELECTIVITY

This is a continuation of copending application Ser. No. 07/737,625 filed on Jul. 30, 1991 now U.S. Pat. No. 5,177,750.

BACKGROUND OF THE INVENTION

This invention pertains generally to lasers, and more particularly to tunable external cavity semiconductor lasers. The invention is an improvement of the invention disclosed in U.S. Pat. No. 4,942,583, issued Jul. 17, 1990 to the present inventor and several co-inventors, and both inventions are commonly owned. U.S. Pat. No. 4,942,583 shall be referenced in the following as "'583", and is incorporated by reference herein.

In a diffraction grating tuned external-cavity laser, the external cavity forming the optical resonance structure has a diffraction grating at one end that may be rotated about an axis parallel to the grating rulings. The grating diffracts an incident beam into a multiplicity of spectral orders, each spread over a small range of angles about the rotation axis. One of these orders is retroflected back toward the light source by orienting the grating at the proper range of angles, known as the Littrow configuration. Wavelength selection is obtained by rotating the grating within the range of angles corresponding to this retroflected order so that the desired wavelength is reflected back to the light-emitting semiconductor, producing laser action at this wavelength.

This system is very sensitive to misalignment of the diffraction grating. Unintended rotations of the grating by small angles about an axis perpendicular to the optical axis and the direction of the rulings can drastically reduce the amount of reflected light that is fed back to the source. Such undesired rotations can be caused by misalignment of the grating rotation axis with the rulings, and by mechanical shock and vibration.

The foregoing alignment problem is addressed by Patent '583, which discloses an optical relay disposed in the external cavity beam between the semiconductor light source and the diffraction grating. A preferred embodiment of the '583 invention is illustrated in FIG. 1, which reproduces the basic features of FIG. 9 of patent '583. In this Figure the light from the semiconductor light source passes through a collimating lens, shown as a SEL-FOC lens in the drawing, then through a prism pair which expands the beam along a transverse axis (T) perpendicular to the grating rulings, and then through a cylindrical lens which contracts the beam along an axis (P) parallel to the rulings. The emerging beam is focused to a waist at the grating which has a very narrow width parallel to the rulings and a broad width perpendicular to these rulings. As disclosed in the patent, the retroreflected beam from the grating is relatively insensitive to undesired rotations of the grating about the T axis for a given sensitivity to rotations about the P axis.

The '583 system shown in FIG. 1, by addressing the alignment problem, is a great improvement over the prior art. However, the stability of an external cavity laser system is still problematic. Beam shaping elements such as the prism pair beam expander and the cylindrical lens beam contractor tend to increase the optical length of the external cavity. As the optical length of the cavity is increased, the wavelength interval between the longitudinal resonant modes of the cavity is decreased thereby degrading the mode stability and selectivity of the laser system.

As such, there is still an acute need for an external cavity laser system which is insensitive to grating rotations in the T axis and which has excellent mode stability and selectivity.

SUMMARY OF THE INVENTION

The present invention overcomes the foregoing problems by rearranging the optical elements in the optical relay so that the cylindrical lens does not reduce the mode selectivity. In this system the cylindrical lens is placed between the collimating lens and the beam expander prisms. The focal length of the cylindrical lens therefore falls within the beam expanding portion of the system, and does not increase the optical path length, compared to a system without this lens. In the preferred embodiment, the cylindrical lens is attached in optical contact to the input face of the first prism. An alternative embodiment includes a first prism having a cylindrical input face, so that the cylindrical lens is integral with this prism.

An object of this invention is to provide a misalignment-tolerant, grating-tuned, external-cavity laser having improved longitudinal mode selectivity. A second object of this invention is to provide a misalignment-tolerant, grating-tuned, external-cavity laser having a reduced effective focal length.

These and other objects, features and advantages of the present invention will become apparent from the following description and illustrative drawings of the preferred embodiment.

DETAILED DESCRIPTION OF THE PREFERRED EMBODIMENT

The following is a detailed description of the preferred embodiment of the present invention. A significant feature of the present invention is the new and novel arrangement of the optical elements to produce a shorter optical path length than the prior art.

Figure 1:
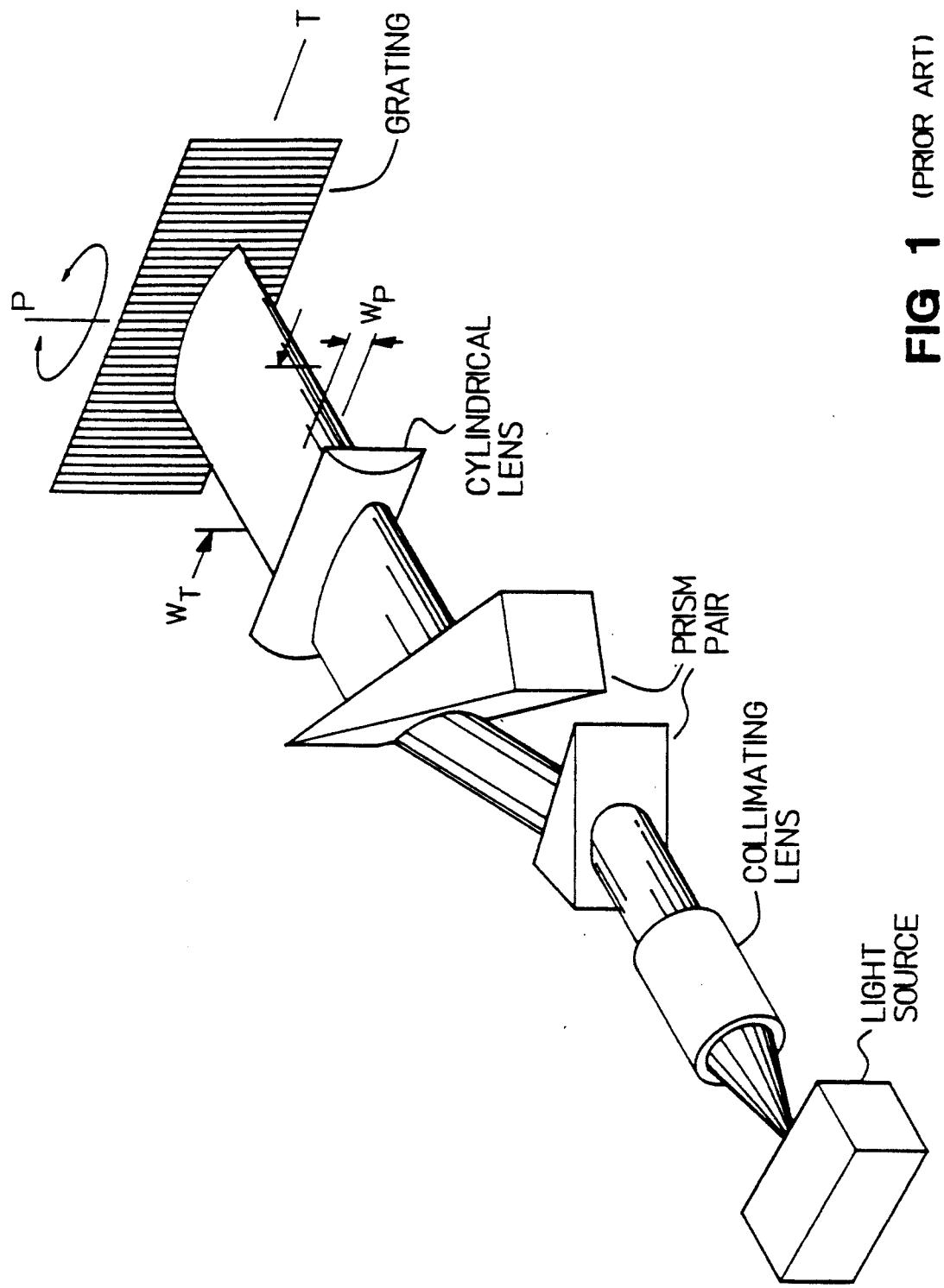
FIG. 1 shows a perspective view of an embodiment of grating-tuned external-cavity laser having beam expander and anamorphic elements as disclosed in Patent '583, and substantially reproduces FIG. 9 of that Patent.
Figure 2:
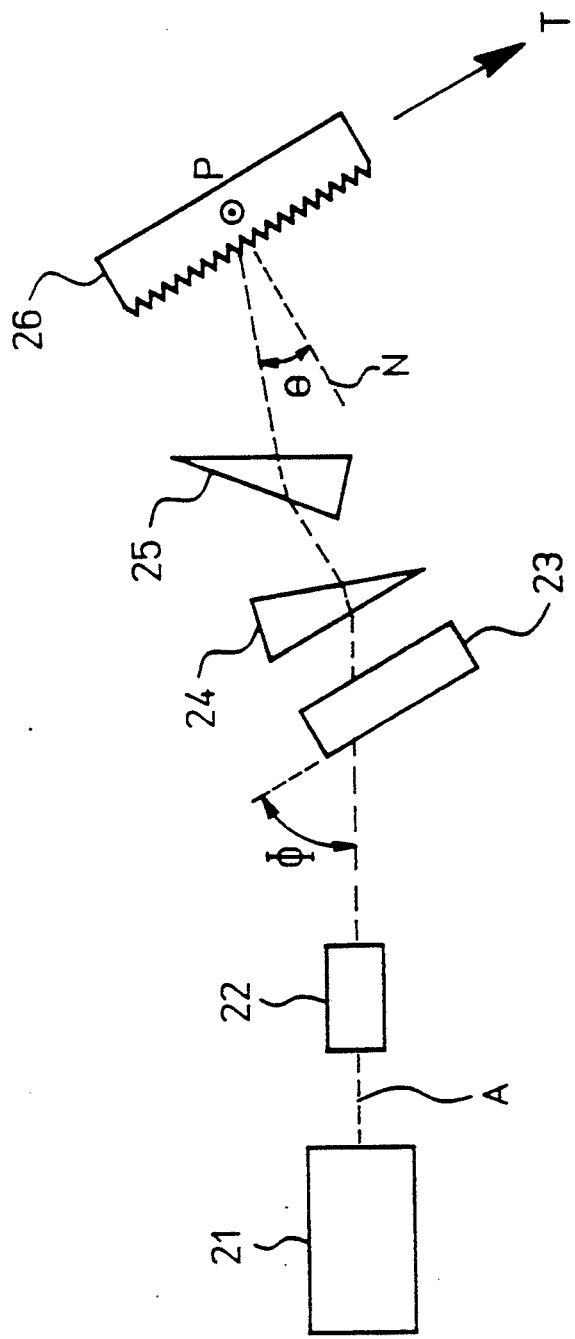
FIG. 2 is a top view of a grating-tuned external-cavity laser according to the present invention.

As shown in FIG. 2, the elements of a grating-tuned external-cavity laser are similar to those shown in FIG. 1 (FIG. 9 of '583) but rearranged to produce a shorter optical path length. A light beam is provided by a light source 21 such as, for example, a semiconductor laser. The light from this source passes through a collimating lens 22, which may be a SEL-FOC or GRIN lens. The collimated light beam then passes through a cylindrical lens 23 which, in FIG. 2, has a cylindrical axis in the plane of the drawing. This lens focuses the beam in the plane perpendicular to the drawing so that the focal waist occurs at a diffraction grating 26, while causing no focusing in the plane lying in the plane of the drawing.

From the cylindrical lens 23 the beam passes through a prism pair 24 and 25. These prisms cause the beam to expand in the plane of the drawing, while causing no focusing in the plane perpendicular to the drawing. The combination of the elements 22, 23, 24, and 25 constitutes the optical relay section of the present laser. The net effect of this optical relay is to cause a substantially circular laser spot produced by the source 21 to be focused to a highly linear spot at the diffraction grating 26. This linear spot has a very narrow waist (height) $W_p$ in the plane perpendicular to the drawing, compared to a wide waist $W_t$ in the plane of the drawing.

The diffraction grating 26 has rulings perpendicular to the plane of the drawing (i.e. the rulings are vertical, and the drawing is a top view). The grating is oriented in the Littrow configuration, at an angle $\Theta$ between a normal N of the grating and the optical axis A, so that the desired spectral order is retroflected back to the light source 21. The laser is tuned by rotating the grating about the vertical axis P (perpendicular to the drawing plane) to select the desired wavelength of laser operation.

This laser system is misalignment-tolerant and insensitive to undesired rotations of the grating about the horizontal axis T lying in the plane of the grating, for the same reason as the laser system shown in FIG. 1 (and FIG. 9 of '583). The highly linear beam spot of the grating, elongated along the axis denoted by T, is relatively unaffected by rotations of the grating about T.

By combining the optical elements in this new and novel way, the overall optical path length of the laser cavity of this new invention is substantially less than prior art systems. Therefore the cavity resonance modes of the present invention are separated by greater wavelength intervals than those using the arrangement of optical elements illustrated in FIG. 1. This increases the mode selectivity of the present invention and decreases mode instability, in comparison with prior art laser systems.

In FIG. 2, the cylindrical lens 23 is tilted at an acute $\Theta$ angle to the optical axis A, the angle is indicated by the dotted line. Ideally this angle is the same as the orientation angle of the grating 26 relative to the optical axis. In practice the orientation angle of the grating changes as the laser is tuned. If the cylindrical lens 23 is at a fixed orientation, its angle relative to the optical axis optimally corresponds to the angle of the grating at the midpoint of the tuning range. Patent '583 discloses the reasons why this is not a practical impediment to the operation of the device, as well as alternative schemes for dealing with this problem.

Figure 3:
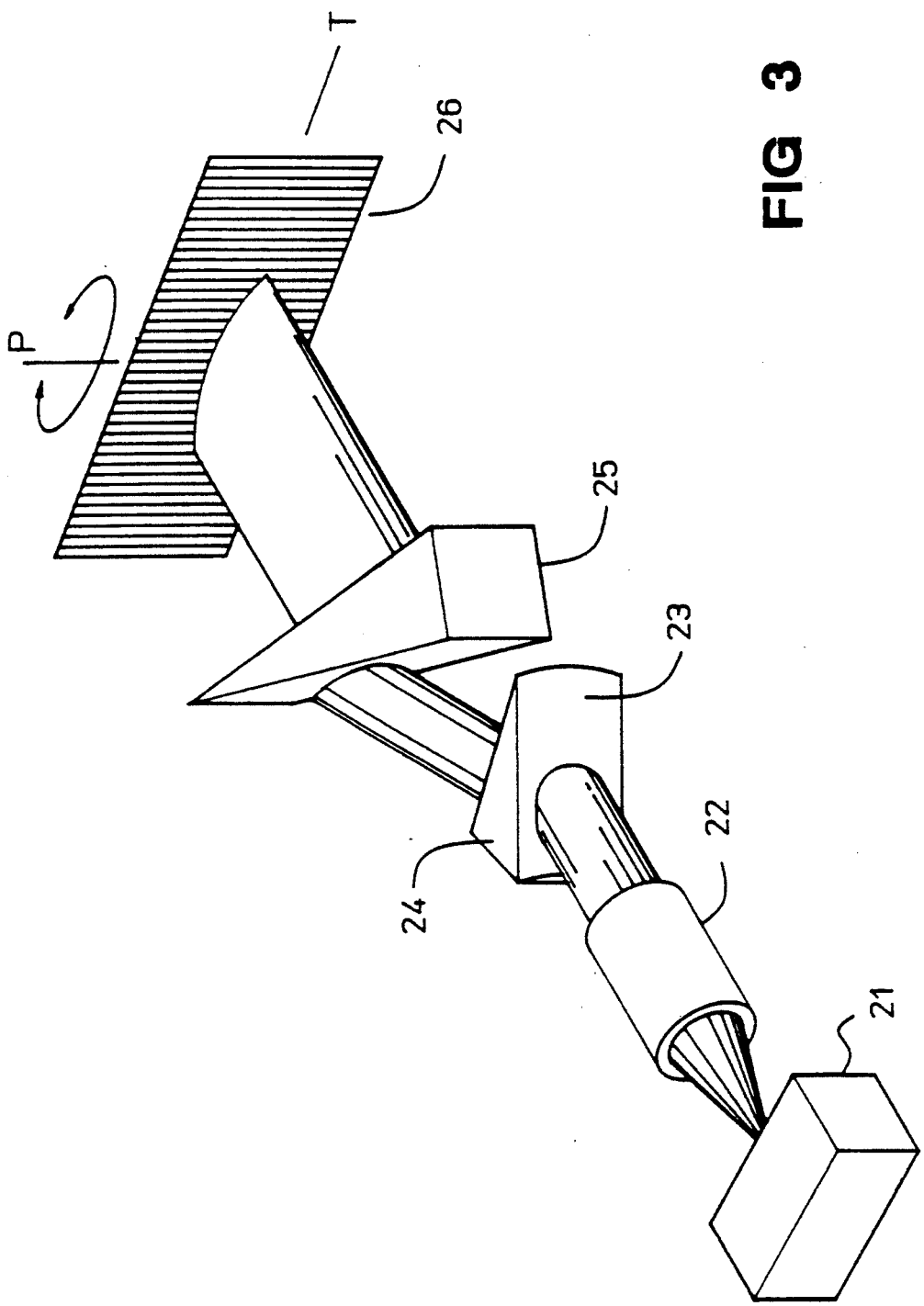
FIG. 3 is a perspective view of the invention as shown in FIG. 2 with the cylindrical lens and the first prism combined.

FIG. 3 shows the preferred embodiment with the cylindrical lens 23 combined with the prism 24. The lens 23 and prism 24 are either be attached to each other with glue or manufactured as a integral unit. The diffraction grating pitch and the refractive index of the prism material are chosen to satisfy the conditions governing the orientation angle of the cylindrical lens 23 as is known in the art and disclosed in '583.

The foregoing detailed description is intended solely to describe and illustrate the advantages, features and characteristics of the invention. Other variations and modifications may be made within the spirit and scope of the invention. For example, the cylindrical lens and both prisms can be fabricated as a single integral unit. The scope of the present invention is to be determined solely by reference to the following claims.

I claim:

1. A grating tuned external cavity laser system comprising:
   a laser amplifier that emits a laser beam along an optical axis A, said laser beam having a pair of lateral dimensions $W_P$ and $W_T$ where $W_P$ is measured along a direction parallel to an axis P perpendicular to optical axis A and $W_T$ is measured along a direction parallel to an axis T perpendicular to axis A and P, said lateral dimensions $W_P$ and $W_T$ being referred to herein as laser beam height and width, respectively;
   a grating positioned in the path of said laser beam and oriented relative to said laser amplifier to produce a diffraction order that retroflects back to the laser amplifier, thereby forming an external cavity with said laser amplifier where the external cavity feeds back, to the laser amplifier, laser beam energy having an average value; wherein said grating is rotatable about axis P to enable tuning of the laser amplifier and the grating contains a set of grating rulings that are substantially parallel to axis P; and wherein a normal N to a front face of the grating at the intersection of the optical axis with the grating makes an angle $\theta$ with the optical axis A at the grating;
   a beam expander, positioned in the path of said laser beam between said laser amplifier and said grating, that expands the beam at the grating in a direction substantially perpendicular to the rulings of said grating; and
   a cylindrical lens, positioned in the path of said laser beam between said laser amplifier and said beam expander, for reducing the ratio of laser beam height to laser beam width to produce on said grating a laser spot having a ratio height $W_P$ to width $W_T$ much less than 1, the cylindrical lens having a focal length falling in part within the beam expander thereby substantially reducing the effective focal length of the laser cavity to produce a shorter optical path length and to improve longitudinal mode selectivity.

2. A grating tuned laser system as in claim 1 wherein:
   a physical separation between the grating and the cylindrical lens along the direction of the laser beam is selected to maximize the average feedback of the external cavity over the tuning range of the laser system.

3. A grating tuned laser system as in claim 1 wherein; the cylindrical lens is oriented at a fixed angle $\Phi$ relative to the optical axis A of the laser beam at the cylindrical lens, the angle $\Phi$ being selected to optimize, at a single wavelength within the tuning range of the laser, the ratio of height $W_P$ to width $W_T$ of the laser spot on the grating.

4. A grating tuned laser system as in claim 1 wherein the cylindrical lens is oriented at a fixed angle $\Phi$ relative to the optical axis A of the laser beam at the cylindrical lens, the angle $\Phi$ being selected to maximize the average feedback of the external cavity over the tuning range of the laser system.

5. A grating tuned laser system as in claim 1, wherein the beam expander comprises:
   a first prism positioned between the cylindrical lens and the grating; and
   a second prism positioned between said the first prism and the grating;
   wherein the first prism and the second prism refract the beam in a plane perpendicular to the axis P, and the combination of the first prism and the second prism thereby increases the laser beam width $W_T$ passing from the laser amplifier to the grating.

6. A grating tuned laser system as in claim 5, wherein the cylindrical lens is rigidly attached to, and optically coupled to, the first prism.

7. A grating tuned laser system as in claim 5, wherein the cylindrical lens and the first prism are integrally fabricated as a single piece of optical material.

8. A grating tuned, external cavity laser system comprising:
- a laser amplifier with a laser beam output;
- a beam width expander;
- a cylindrical lens located between the laser beam output and the beam expander; and
- a grating to reflect the laser beam back through the beam width expander and the cylindrical lens to the laser amplifier;
- wherein the cylindrical lens has a focal length falling in part within the beam width expander thereby substantially reducing the effective focal length of the laser cavity to produce a shorter optical path length and to improve longitudinal mode selectivity.

9. A grating tuned, external cavity laser system as in claim 8 wherein the beam width expander and the cylindrical lens are joined together to form a single element that expands the laser beam width and contracts the laser beam height.

10. A grating tuned, external cavity laser system as in claim 8 wherein the beam width expander and the cylindrical lens are fabricated from a single piece of optical material.

11. A grating tuned, external cavity laser system as in claim 8 wherein the beam width expander includes a first prism and a second prism.

12. A grating tuned, external cavity laser system as in claim 11 wherein the cylindrical lens is integral with the first prism means.

13. An external cavity laser system comprising:
- a laser amplifier with a laser beam output;
- a beam width expander;
- a grating including lines; and
- a cylindrical lens located between the laser beam output and the grating and in optical cooperation with the beam width expander,
- the cylindrical lens having a focal length falling in part within the beam width expander thereby reducing the effective focal length of the laser cavity to produce a shorter optical path length and to improve longitudinal mode selectivity, the grating operative to reflect the laser beam back through the beam width expander and the cylindrical lens to the laser amplifier, the beam width expander including a first prism positioned between the laser beam output and the grating and a second prism in optical cooperation with the first prism and positioned between the first prism and the grating, the first prism and the second prism operative to refract the laser beam in a plane substantially perpendicular to the lines of the grating.

14. An external cavity laser system as in claim 13, wherein the cylindrical lens is located between the second prism and the laser output.

15. An external cavity laser system as in claim 13, wherein the cylindrical lens is rigidly attached to, and optically coupled to, the second prism.

16. An external cavity laser system as in claim 13, wherein the beam height contractor comprises a cylindrical lens and the cylindrical lens and the second prism are integrally fabricated as a single piece of optical material.

* * * * *